DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED SEPTEMBER 2, 1975

938 O.G. 7

T938,004

FIELD EFFECT TRANSISTOR GATE DIELECTRIC

Herbert S. Lehman, William A. Pliskin, and Benjamin H. Vromen, Poughkeepsie, N.Y., assignors to International Business Machines Corporation, Armonk, N.Y.

Continuation of abandoned application Ser. No. 319,585, Dec. 29, 1972. This application Aug. 2, 1974, Ser. No. 494,258

**Int. Cl. H01l *11/14***

U.S. Cl. 357—23

1 Sheet Drawing. 14 Pages Specification

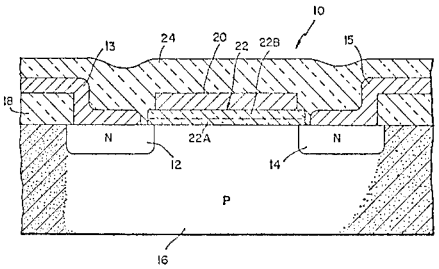

A field effect transistor gate dielectric on a monocrystalline silicon body that has excellent threshold stability characteristics, and improved dielectric integrity. The gate dielectric is a composite layer having a genetic silicon dioxide layer formed by thermally oxidizing the body, and a second contiguous overlying layer of vapor deposited $SiO_2$ levels.

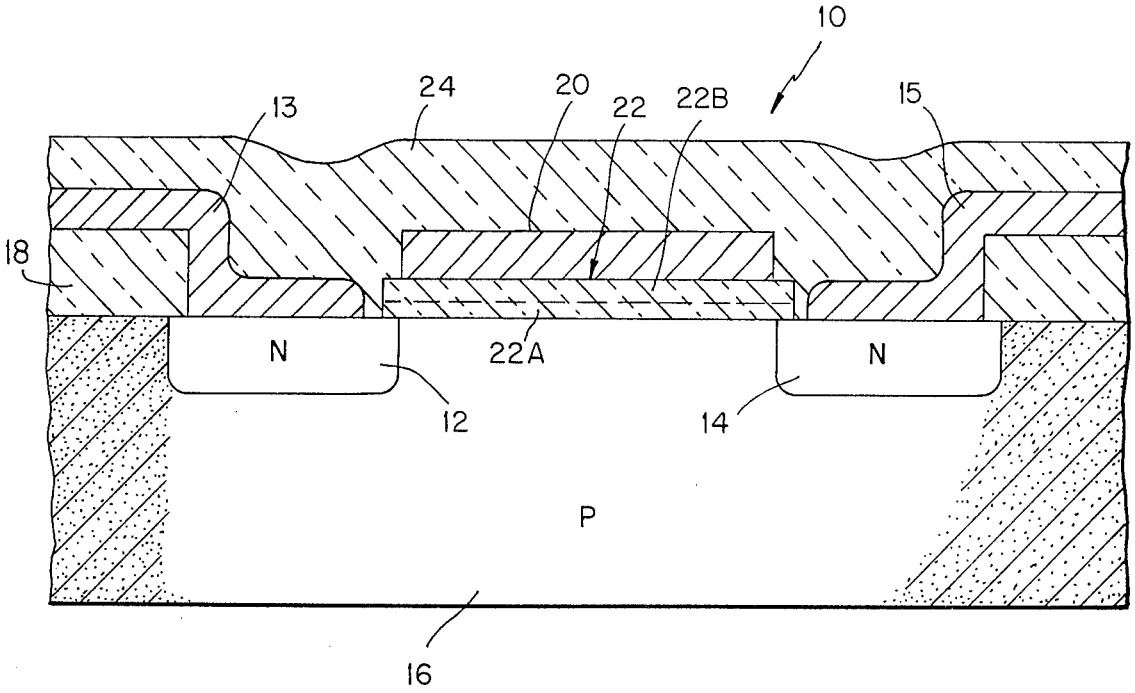

FIELD EFFECT TRANSISTOR GATE DIELECTRIC
Original Filed Dec. 29, 1972